United States Patent
Völkening et al.

(10) Patent No.: US 8,915,436 B2
(45) Date of Patent: *Dec. 23, 2014

(54) METHOD AND APPARATUS FOR OPTICALLY READING INFORMATION

(75) Inventors: Stephan Völkening, Köln (DE); Torsten Hupe, Oberhaching (DE)

(73) Assignee: Certego GmbH, Oberhacing (DE)

( * ) Notice: Subject to any disclaimer, the term of this patent is extended or adjusted under 35 U.S.C. 154(b) by 1266 days.

This patent is subject to a terminal disclaimer.

(21) Appl. No.: 12/293,616

(22) PCT Filed: Mar. 9, 2007

(86) PCT No.: PCT/EP2007/002060
§ 371 (c)(1),
(2), (4) Date: May 12, 2010

(87) PCT Pub. No.: WO2007/107251
PCT Pub. Date: Sep. 27, 2007

(65) Prior Publication Data
US 2011/0121073 A1   May 26, 2011
US 2012/0037698 A9   Feb. 16, 2012

(30) Foreign Application Priority Data

Mar. 22, 2006   (DE) .................. 10 2006 012 991

(51) Int. Cl.
| | |
|---|---|
| *G06K 7/10* | (2006.01) |
| *G06K 5/00* | (2006.01) |
| *G03H 1/16* | (2006.01) |
| *G06K 19/16* | (2006.01) |
| *G11C 13/04* | (2006.01) |
| *G03H 1/22* | (2006.01) |
| *G03H 1/30* | (2006.01) |

(52) U.S. Cl.
CPC ......... *G03H 1/16* (2013.01); *G03H 2001/2231* (2013.01); *G03H 2001/306* (2013.01); *G06K 19/16* (2013.01); *G11C 13/042* (2013.01)
USPC .......................................... 235/457; 235/380

(58) Field of Classification Search
USPC ......... 235/454, 462.34, 457, 380, 487; 359/2, 359/3, 399, 30, 619, 13, 15; 382/210, 115, 382/100
See application file for complete search history.

(56) References Cited

U.S. PATENT DOCUMENTS

| | | | |
|---|---|---|---|
| 3,328,209 A | 6/1967 | Schneider |
| 4,094,011 A | 6/1978 | Nagao |

(Continued)

FOREIGN PATENT DOCUMENTS

| | | |
|---|---|---|
| CA | 1298913 C | 4/1992 |
| EP | 0231351 A1 | 8/1987 |

(Continued)

OTHER PUBLICATIONS

L.H. Lin, "A Method of Hologram Information Reduction by Spatial Frequency Sampling"; Applied Optics; Mar. 1968; vol. 7; No. 3; pp. 545-548.

(Continued)

*Primary Examiner* — Thien T Mai
(74) *Attorney, Agent, or Firm* — Miles & Stockbridge P.C.

(57) ABSTRACT

The present invention relates to a novel type of information carrier, on which information is stored in the form of diffraction structures. The information carrier according to the invention can be read by being drawn manually through a reading device. The present invention also relates to a device with which an information carrier according to the invention can be read.

8 Claims, 4 Drawing Sheets

(56) References Cited

U.S. PATENT DOCUMENTS

| | | | |
|---|---|---|---|
| 4,304,992 A | 12/1981 | Kobayashi et al. | |
| 4,683,371 A | 7/1987 | Drexler | |
| 4,837,134 A | 6/1989 | Bouldin et al. | |
| 5,100,222 A | 3/1992 | Minoura et al. | |
| 5,128,524 A | 7/1992 | Anglin et al. | |
| 5,336,871 A | 8/1994 | Colgate, Jr. | |
| 5,621,515 A * | 4/1997 | Hoshino et al. | 235/457 |
| 5,644,412 A | 7/1997 | Yamazaki et al. | |
| 6,005,691 A * | 12/1999 | Grot et al. | 235/457 |
| 6,328,209 B1 | 12/2001 | O'Boyle | |
| 7,315,501 B1 * | 1/2008 | Ramanujam et al. | 369/103 |
| 2002/0043562 A1 | 4/2002 | Zazzu et al. | |
| 2002/0080994 A1* | 6/2002 | Lofgren et al. | 382/100 |
| 2004/0016810 A1* | 1/2004 | Hori et al. | 235/454 |
| 2004/0031849 A1* | 2/2004 | Hori et al. | 235/454 |
| 2005/0100222 A1 | 5/2005 | McGrew | |

FOREIGN PATENT DOCUMENTS

| | | |
|---|---|---|
| EP | 1 080 466 A1 | 3/2001 |
| EP | 1 252 623 A2 | 10/2002 |
| JP | 2000268147 A * | 9/2000 |
| JP | 2001118123 A * | 4/2001 |
| WO | 87/00947 A1 | 2/1987 |
| WO | 88/08120 A1 | 10/1988 |
| WO | WO 99/57719 | 11/1999 |
| WO | WO 01/57859 | 8/2001 |

OTHER PUBLICATIONS

International Search Report dated Jul. 5, 2007 (6 pages).

Office Action issued in Israeli Patent Application No. 194084 dated Oct. 10, 2011.

P. Hariharan, "Basics of Holography", Cambridge University Press, 2002, p. 8-10.

"International Standard, Information Technology—Automatic Identification and Data Capture Techniques—Data Matrix Bar Code Symbology Specification", Second Edition, Sep. 16, 2006, Reference No. ISO/IEC 16022:2006.

L.P. Yaroslavskii, "Advances in Electronics and Electron Physics", vol. 66, Editor Peter W. Hawks, Academic Press, Inc. 1986, pp. 92-140.

* cited by examiner

METHOD AND APPARATUS FOR OPTICALLY READING INFORMATION

CROSS REFERENCE TO RELATED APPLICATIONS

This application is a §371 National Stage Application of PCT/EP2007/002060 filed Mar. 9, 2007 which claims priority from German Application 10 2006 012 991.1 filed Mar. 22, 2006.

BACKGROUND OF THE INVENTION

1. Field of the Invention

The present invention relates to a novel type of information carrier, on which information is stored in the form of diffraction structures. The information carrier according to the invention can be read by being drawn manually through a reading device.

2. Description of Related Art

Plastic cards as information carriers are ubiquitous nowadays. As a consequence of increasing data processing by machine, a person typically has a series of plastic cards with which he can authenticate himself Examples which may be mentioned are company identity cards, medical insurance cards, credit, Eurocheque and debit cards.

Particularly widespread is the ID-1 format, which is characterized in the ISO/IEC 7810 Standard ("credit card format"). It has a convenient size and can be accommodated in purses. There are many card readers which are based on this format.

Machine-readable information can be stored on plastic cards in various ways. For instance, optically in the form of optically readable letters (OCR=Optical Character Recognition), bar or matrix codes, magnetically in a magnetic strip or electronically in a chip. However, the aforementioned storage methods only permit the storage of a few bytes (OCR) to kilobytes (chip). The greatest storage capacity in plastic cards is achieved nowadays by optical memory cards.

In WO8808120 (A1) and EP0231351 (A1), optical memory cards are described in which data is exposed photographically into a silver halide film which is applied to the plastic cards. The data can be written and read with a laser. In WO 8808120(A1), a device is described with which the film can be written and read. The data is present digitally in the form of data points. The data points exhibit a different reflectance as compared with the surroundings and in this way can be read with the aid of a laser beam and a photodetector.

The disadvantage with the card and the card reader described is that the card must be positioned exactly with respect to read beam and detector in order to be able to read the data. In order to read out the individual data points one after another, the card must also be moved in relation to read beam and detector in such a way that the read beam strikes the data points accurately. This requires a complex card reader having a high positioning accuracy. Moreover, the data density on the card is restricted to the dimension of the positioning accuracy during reading. If the data points are present more densely than the positioning accuracy of the read beam, the individual data points can no longer be detected.

When bar code or magnetic strip cards are used, it is possible to draw the card through a card guide in order to read it. The data are read as the card is drawn through manually. Mechanical positioning of the read head in relation to the card is not necessary.

Such a draw-through system for magnetic strip cards is described, for example, in U.S. Pat. No. 5,128,524 (A1).

The implementation of a manual card draw-through system for reading data which are stored on plastic cards is possible in the case of magnetic strips and bar codes, since the data density (quantity of bytes per unit area) is so low that the positioning of the storage medium in relation to the read head is tolerant with respect to the changes which occur during the manual card guidance.

In the optical memory cards described above, the data structures are smaller. Manual positioning of the card in relation to the read head is therefore generally no longer possible.

However, it would be desirable to be able to read optical memory cards having a higher storage capacity than is usual in the case of magnetic strip or bar code cards with the aid of a card draw-through system that can be operated manually.

Advantages of manual card guidance are, firstly, higher convenience for the user, since he does not have to let go of the card, and increased speed of the entire reading process associated with this and, secondly, lower production costs of the device, since it is possible to dispense with expensive mechanical positioning, and also greater ruggedness of the device.

SUMMARY OF THE INVENTION

There was therefore the object of providing an optical memory card which can be read with the aid of a card draw-through system that can be operated manually.

Surprisingly, it has been found that this object is achieved by the optical memory cards according to the invention described below.

In particular, the optical memory cards according to the invention can be read as they are drawn manually through a card guide, although the structures which represent the data in the storage medium are smaller than the positioning accuracy as the card is drawn through manually.

Furthermore, the optical memory cards according to the invention have a higher storage capacity than the memory cards known from the prior art.

This is achieved by means of information carriers, in particular optical memory cards, on which data are stored in the form of Fourier holograms. Such information carriers form a first subject of the present invention.

In one embodiment, the information (data) to be read is present in the form of Fourier holograms on a flat information carrier, for example a plastic card.

DETAILED DESCRIPTION OF A PREFERRED EMBODIMENT

Suitable storage media for the hologram are all materials which are conventional and known to those skilled in the art in which a flat surface can be produced. Examples of this are polymers, metals, papers, textiles, coatings, stoneware and so on, into which the holographic structures are introduced by means of embossing, etching, photolithography, granolithography, abrasion or cutting. Composite materials, which are formed by combination of the above-mentioned materials, are also conceivable.

One example of this is polymer films to which a metal film is applied. In the case of photosensitive materials or composite materials with photosensitive components, the holographic structures can also be introduced by using light (silver halide film, film made of photo-addressable polymer and so on).

A flat information carrier is understood to be an information carrier which has a radius of curvature which is substantially larger than the information carrier itself. Such a flat information carrier is, for example, a credit card which has been bent in the purse such that it has a radius of curvature of 3 m, while the card itself is only about 8 cm long and about 5 cm wide.

The storage medium for the hologram can in this case both be part of the information carrier itself and also merely firmly connected to the information carrier.

The holograms can be read in reflection or transmission. They are preferably read in reflection. To this end, a light-reflecting surface is required, to which the hologram is applied or into which the hologram is introduced.

The information carrier should preferably be smooth, that is to say the roughness should be less than the holographic structures. The roughness can be determined, for example, by means of feeler methods (measuring instrument: KLA Tencor Alpha Step 500; measuring method: MM-40001). The surface roughness is preferably less than $R_a=10$ micrometers.

The data to be stored holographically are preferably present as a two-dimensional distribution of lightness values. One example which may be mentioned is the data matrix code which is specified in ISO/IEC 16022.

Figure 1:
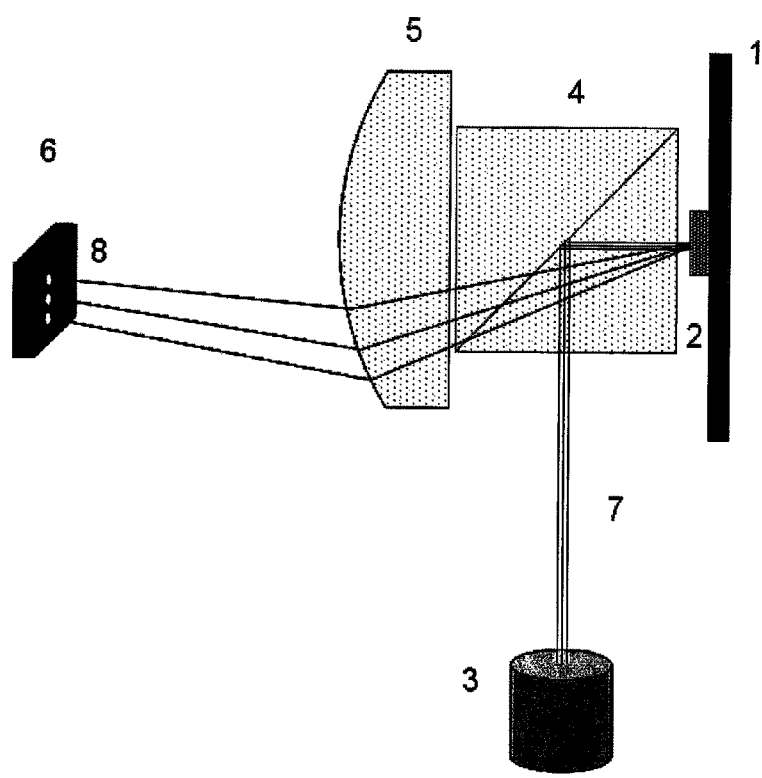
FIG. 1 shows irradiation of a Fourier hologram with a collimated laser beam, wherein light beams are diffracted at different angles at the hologram.

In the case of storing such data as a Fourier hologram, the physical lightness distribution of the object is encoded in the Fourier hologram in the form of angles. This is illustrated schematically in FIG. 1: During the irradiation of the Fourier hologram (2) with a collimated laser beam (7), the light beams are diffracted at different angles at the hologram.

Fourier holograms are known and their properties are described, for example, in P. Hariharan, Basics of Holography, Cambridge University Press, 2002, pages 8 to 10.

With the aid of Fourier optics, the angles can be led back into location information again (FIG. 1 and FIGS. 2A, 2B, and 2C): The beams diffracted at the same angle are focused at a point by the Fourier lens (5). The beams diffracted at different angles are focused at different points by the Fourier lens.

The points can be imaged on a detector, for example a camera, and can thus be processed further electronically.

Figure 2A:
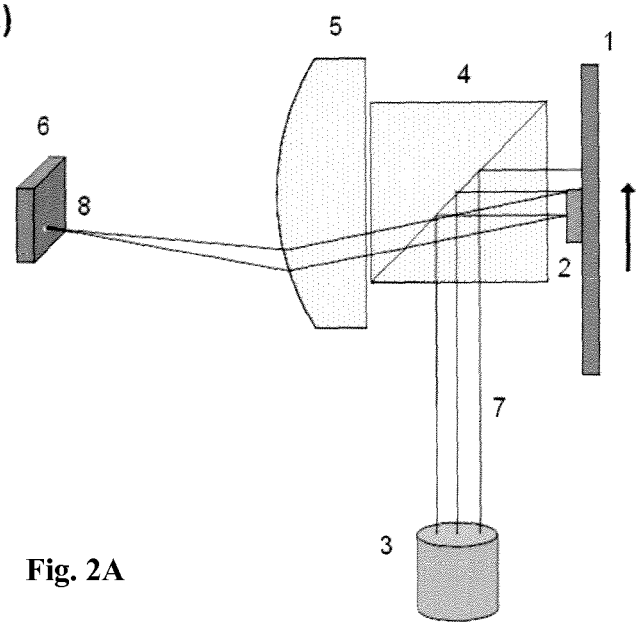
FIGS. 2A, 2B, and 2C show irradiation of a Fourier hologram with a collimated laser beam, wherein light beams are diffracted at different points by the Fourier lens.
Figure 2B:
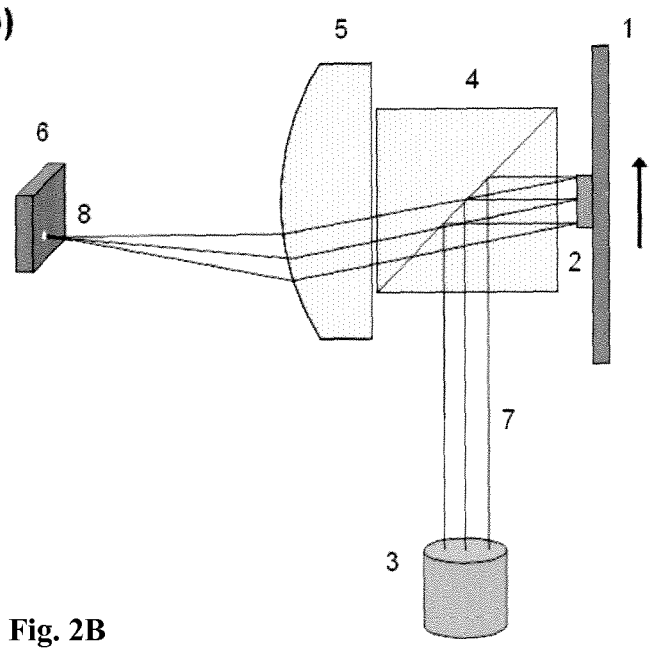
Figure 2C:
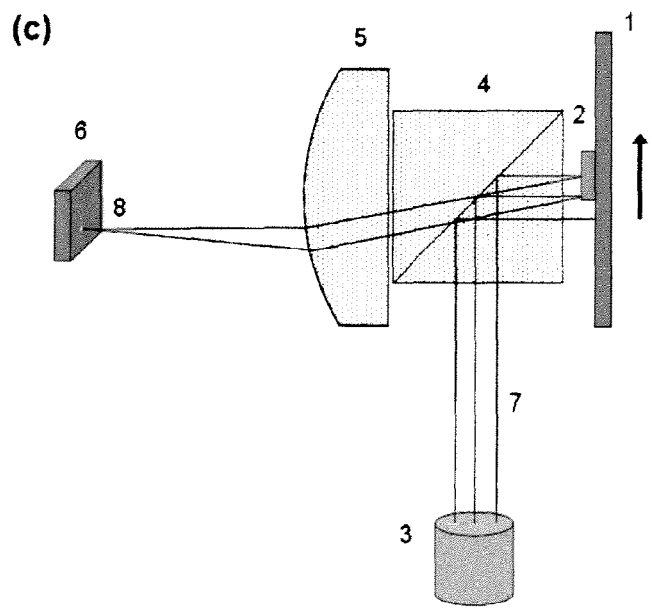

One important property of the Fourier holograms in combination with Fourier optics is that the points imaged on the detector are not displaced if the hologram is displaced at right angles to the incident laser beam. Only the intensity of the image on the detector changes. This is illustrated in FIGS. 2A, 2B, and 2C: If the Fourier hologram (2) is moved through the reader (7), an image appears on the detector as soon as the read beam strikes the hologram partly. The intensity (brightness) of the image rises until the read beam is irradiating the entire hologram and then decreases to zero again until the read beam is no longer illuminating the hologram.

Surprisingly, it has been established that this effect can be used to read information which is stored on a flat information carrier in the form of Fourier holograms while the information carrier is being displaced in relation to an incident laser beam, that is to say, for example, is being moved manually through a guide.

If the hologram is registered only partially by the read spot, then the image is less bright and less sharp than if the entire hologram is registered by the read spot. From this, it could easily be concluded that it is particularly beneficial to configure the read spot to be larger than the hologram in order that, during the reading process, as many regions of the hologram as possible are always registered by the read spot. However, this is not the case. If the read spot is larger than the hologram, then parts of the information carrier which do not have a hologram are also always illuminated. As a result, in general fewer light beams are deflected at the hologram, so that the brightness decreases. In addition, scattering effects as a result of irradiating the information carrier outside the hologram lead to increased background noise on the detector.

Surprisingly, it has been found that the imaging properties during irradiation of the hologram are particularly good if the read spot is smaller than the hologram. The read spot is particularly preferably 0.9 to 0.1 times as large as the hologram.

Particularly good imaging properties are achieved if a plurality of holograms having the same content is placed directly on one another to form a larger hologram. Particularly preferably, 2 to 9 holograms with the same content are placed directly on one another and therefore form an enlarged hologram.

The geometry of the Fourier holograms is preferably matched to the profile of the read spot. Conventional lasers as a source of the read beam produce a circular or elliptical read spot, in which the intensity decreases from the inside towards the outside.

Figure 4:
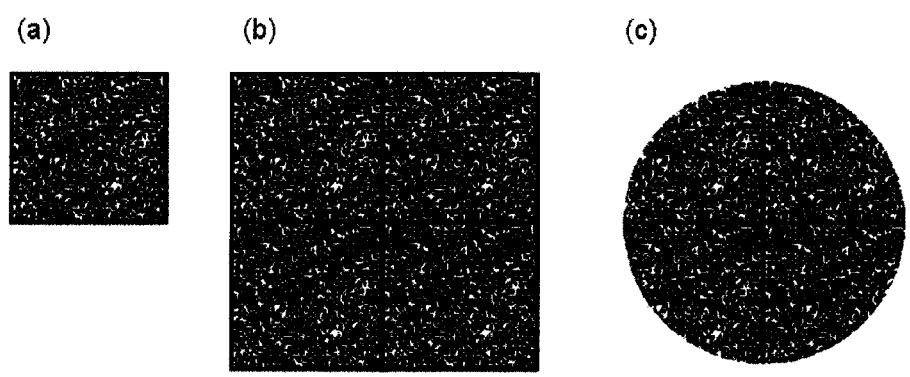
FIG. 4A shows a Fourier hologram.
FIG. 4B shows the hologram of FIG. 4A quadrupled, the four identical holograms being arranged in the form of a rectangle.
FIG. 4C shows the enlarged hologram cut in such a way that the hologram has the shape of the read spot.

Particularly good images are obtained if four holograms with the same content are assembled to form a larger hologram, of which only a central circular or elliptical region which is somewhat larger than the read spot is applied to the information carrier, as illustrated in FIG. 4: FIG. 4(a) shows a Fourier hologram. This is quadrupled in FIG. 4(b), the four identical holograms being arranged in the form of a rectangle. In FIG. 4(c) the enlarged hologram is cut in such a way that the hologram has the shape of the read spot. For the purpose of better illustration, in FIG. 4 the individual holograms are provided with a black frame, which, however, does not actually occur.

The size of the holograms is preferably 0.1 to 5 mm in diameter.

A further subject of the present invention is a device for reading the optical memory cards according to the invention. Such a device comprises a light source for a read beam, Fourier optics, a photodetector and a guide device which aligns the information carrier in relation to the read beam and to the photodetector during the movement during the reading operation, in particular when being drawn manually through the device. The guide restricts the movement of the information carrier in two spatial dimensions, while the information carrier is moved in the third spatial direction. The information carrier is, for example, moved manually through the guide and in the process is illuminated with a light beam. The light beam is diffracted at the Fourier hologram of the information carrier, and the diffracted beams are imaged with the aid of Fourier optics onto a detector, where the optical signal is transformed into an electronic signal.

By using the device according to the invention, the optical memory cards according to the invention can be read in transmission and/or reflection.

Figure 3:
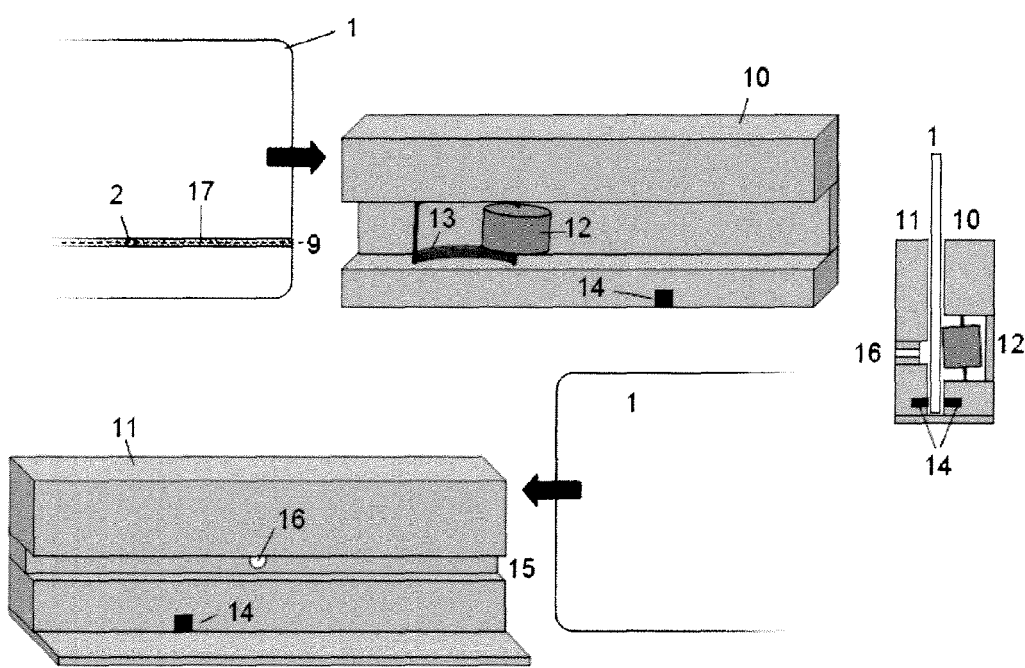
FIG. 3 shows a device for reading optical memory cards, wherein memory cards can be read in reflection.

One example of an embodiment of such a device, with which memory cards can be read in reflection, is illustrated in FIG. 3. It comprises two guide rails (10 and 11), between which the information carrier (1) is moved manually. One of the guide rails (10 here) has a roller (12), which is mounted with a pressure spring (13) and presses the information carrier (1) against the other rail (11 here) as it is drawn through manually. The roller is tilted slightly, so that an information carrier is pressed downwards automatically as it is drawn through. Therefore, as it is drawn through manually, the information carrier is pressed both against a rail (11 here) and also against the base of the guide. Therefore, two of the three possible spatial directions are restricted. The information carrier is moved in the third spatial direction, parallel to the guide rails 10 and 11.

In the process, it sweeps over the read beam (7), which is incident through a hole (16) in one of the guide rails (11 here). The hole (16) is arranged at the level of the hologram (2) on the information carrier (1). At the same height, a groove (15) is preferably milled in the rail which faces the hologram and in which the hole is located, the said groove preventing a hologram located on the information carrier from being gradually scratched as it is drawn repeatedly through the guide.

A detector (14) is preferably inserted into the guide and detects whether an information carrier is being moved through the guide. For instance, use can be made of a forked light barrier, whose light beam is interrupted by the information carrier. The interruption of the light beam from the light barrier can be used as a trigger for the read beam (3) and the detector (camera) (6). As soon as the light barrier is interrupted, the read beam is switched on and the image on the camera is evaluated.

It is also possible to switch the camera on with a defined time delay in relation to the read beam.

It is likewise possible to use a plurality of light barriers.

It is also possible for a plurality of holograms to be read one after another. The holograms are then arranged on the information carrier at one level, along a line (9) in the storage medium (17).

In the event that a plurality of holograms, which are arranged along a line, is used on an information carrier, it is conceivable, in addition to the holograms, also to insert markings into the information carrier and/or the storage medium, which markings function as a trigger for the camera and/or the read beam. In this way, it is easily possible to signal to the camera when a new hologram is being imaged.

Furthermore, the use of the aforementioned device as a card reader for information carriers in the form of plastic cards of all types (bank cards, credit cards, identity cards, etc.) is also the subject of the present invention.

A further subject of the present invention is a method for data transmission which comprises (a) storing the data in the form of at least one Fourier hologram on a flat information carrier, for example a plastic card, and (b) moving the information carrier through a device comprising Fourier optics, a photodetector and a guide device, which aligns the information carrier in relation to the read beam and to the photodetector during the movement through the device, and reading the stored data in this way. The movement of the information carrier through the device during the reading operation is preferably carried out by drawing it through manually.

A further subject of the present invention is a system for data transmission comprising at least one flat information carrier, for example a plastic card, which contains data stored in the form of at least one Fourier hologram, and at least one reading device comprising Fourier optics, a photodetector and a guide device, which aligns the information carrier in relation to the read beam and to the photodetector during the reading operation, in particular as it is drawn manually through the device.

Such a system can be used for a large number of applications, for example for the authentication of persons or goods or access control to buildings or rooms.

DESIGNATIONS RELATING TO THE FIGURES

1 Information carrier (plastic card)
2 Fourier hologram
3 Light source with collimation optics
4 Beam splitter
5 Fourier lens
6 Detector (camera)
7 Collimated light beam (read beam)
8 Image on the camera
9 Line along which holograms can be stored
10 Guide rail 1
11 Guide rail 2
12 Roller
13 Pressure spring
14 Detector (forked light barrier)
15 Groove
16 Hole for read beam
17 Storage medium

The invention claimed is:

1. A system for data transmission, comprising:
(a) at least one information carrier, comprising a flat plastic optical memory card which contains data stored in the form of two or more Fourier holograms, said Fourier holograms arranged on the card in a line at the same level,
wherein the data stored in the form of two or more Fourier holograms comprises an ISO/IEC 16022 data matrix code,
wherein at least one Fourier hologram comprises a plurality of Fourier holograms combined to form a larger hologram, each hologram of said plurality that form the larger combined hologram having identical data content encoded therein,
wherein markings are applied to the information carrier which are used as a trigger signal for a read beam or a detector,
wherein the larger combined Fourier hologram is larger than a read spot for reading a hologram; and
(b) at least one reading device, said reading device comprising
(i) a light source for producing a read beam,
(ii) Fourier optics,
(iii) a photodetector, and
(iv) a guide device,
wherein the guide device is configured to align the information carrier such that the carrier is positioned at a right angle in relation to a read beam and to the photodetector during the manual movement of the information carrier through the reading device during a reading operation,
wherein said guide device and information carrier are configured such that the reading operation comprises reading at least one Fourier hologram sequentially after reading a first Fourier hologram, as the information carrier is manually moved through the reading device.

2. A method for authentication or for access control, comprising:
(a) utilizing a reading device to read an information carrier, wherein said reading device comprises (i) a light source for producing a read beam;
(ii) Fourier optics;
(iii) a photodetector; and
(iv) a guide device,
wherein the guide device restricts the movement of the information carrier in two spatial dimensions while the information carrier is manually drawn through the reading device in a third spatial direction in relation to the read beam and to the photodetector during a reading operation,
wherein said information carrier comprises a flat plastic optical memory card which contains data stored in the form of two or more Fourier holograms, said Fourier holograms arranged on the card in a line at the same level,
wherein the data stored in the form of two or more Fourier holograms comprises an ISO/IEC 16022 data matrix code,
wherein at least one Fourier hologram comprises a plurality of Fourier holograms combined to form a larger hologram, each hologram of said plurality that form the larger combined hologram having identical data content encoded therein,
wherein markings are applied to the information carrier which are used as a trigger signal for a read beam or a detector,
wherein the larger combined Fourier hologram is larger than a read spot for reading a hologram, and
wherein said reading operation comprises reading at least one Fourier hologram sequentially after reading a first Fourier hologram, as the information carrier is manually drawn through the reading device.

3. A method for data transmission, comprising:
(a) storing data in the form of two or more Fourier holograms on an information carrier, said Fourier holograms arranged on the information carrier in a line at the same level,
wherein the data stored in the form of two or more Fourier holograms comprises an ISO/IEC 16022 data matrix code,
wherein at least one Fourier hologram comprises a plurality of Fourier holograms combined to form a larger hologram, each hologram of said plurality that form the larger combined hologram having identical data content encoded therein,
wherein markings are applied to the information carrier which are used as a trigger signal for a read beam or a detector,
wherein the larger combined Fourier hologram is larger than a read spot for reading a hologram,
wherein said information carrier comprises a flat plastic optical memory card; and
(b) manually moving the information carrier through a reading device, said reading device comprising
(i) a light source for producing a read beam,
(ii) Fourier optics,
(iii) a photodetector, and
(iv) a guide device,
wherein the guide device aligns the information carrier such that the carrier is positioned at a right angle in relation to a read beam and to the photodetector during the manual movement of the information carrier through the reading device; and
(c) reading stored data from the information carrier that is manually moved through the reading device,
wherein said reading of the stored data from the information carrier comprises reading at least one Fourier hologram sequentially after reading a first Fourier hologram, as the information carrier is manually moved through the reading device.

4. A method for authentication or for access control, comprising:
(a) utilizing a system for data transmission, wherein said system comprises
(1) at least one information carrier, comprising a flat plastic optical memory card which contains data stored in the form of two or more Fourier holograms, said Fourier holograms arranged on the card in a line at the same level,
wherein the data stored in the form of two or more Fourier holograms comprises an ISO/IEC 16022 data matrix code,
wherein at least one Fourier hologram comprises a plurality of Fourier holograms combined to form a larger hologram, each hologram of said plurality that form the larger combined hologram having identical data content encoded therein,
wherein markings are applied to the information carrier which are used as a trigger signal for a read beam or a detector,
wherein the larger combined Fourier hologram is larger than a read spot for reading a hologram; and
(2) at least one reading device, said reading device comprising
(i) a light source for producing a read beam,
(ii) Fourier optics,
(iii) a photodetector, and
(iv) a guide device,
wherein the guide device aligns the information carrier such that the carrier is positioned at a right angle in relation to a read beam and to the photodetector during the manual movement of the information carrier through the reading device during a reading operation,
wherein said reading operation comprises reading at least one Fourier hologram sequentially after reading a first Fourier hologram, as the information carrier is manually moved through the reading device.

5. The system according to claim 1, wherein at least one larger combined Fourier hologram consists of four Fourier holograms containing identical data content encoded therein.

6. The system according to claim 1, wherein the read spot is 0.9 to 0.1 times as large as the larger combined Fourier hologram.

7. The system according to claim 1, wherein the geometry of the larger combined Fourier hologram is matched to the profile of the read spot.

8. The system according to claim 1, wherein the larger combined Fourier hologram is 0.1 to 5 mm in diameter.

* * * * *